United States Patent
Wu et al.

(10) Patent No.: US 12,324,132 B2
(45) Date of Patent: Jun. 3, 2025

(54) VEHICLE-MOUNTED POWER SUPPLY APPARATUS AND VEHICLE HAVING SAME

(71) Applicant: BYD COMPANY LIMITED, Guangdong (CN)

(72) Inventors: Bin Wu, Shenzhen (CN); Baochuan Long, Shenzhen (CN); Lianjun Du, Shenzhen (CN); Shulin Liang, Shenzhen (CN); Chao Wang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 243 days.

(21) Appl. No.: 18/015,178

(22) PCT Filed: Jul. 1, 2021

(86) PCT No.: PCT/CN2021/104082
§ 371 (c)(1),
(2) Date: Jan. 9, 2023

(87) PCT Pub. No.: WO2022/007708
PCT Pub. Date: Jan. 13, 2022

(65) Prior Publication Data
US 2023/0200029 A1    Jun. 22, 2023

(30) Foreign Application Priority Data
Jul. 9, 2020 (CN) .................. 202010658596.X

(51) Int. Cl.
*H05K 7/20* (2006.01)
*B60R 16/02* (2006.01)
(Continued)

(52) U.S. Cl.
CPC ......... *H05K 7/20872* (2013.01); *B60R 16/02* (2013.01); *H01F 27/24* (2013.01);
(Continued)

(58) Field of Classification Search
CPC ..................... H05K 7/20272; H05K 9/0037
(Continued)

(56) References Cited

U.S. PATENT DOCUMENTS 3,904,810 A    9/1975  Kraus
6,107,905 A *  8/2000  Itoh .................. F25D 19/006
                                            505/892
(Continued)

FOREIGN PATENT DOCUMENTS

CN    102923076 A    2/2013
CN    202772799 U    3/2013
(Continued)

OTHER PUBLICATIONS

International Search Report and Written Opinion for PCT Application No. PCT/CN2021/104082, mailed on Sep. 28, 2021, 9 pages.

*Primary Examiner* — Hung S. Bui

(57) ABSTRACT

A vehicle-mounted power supply apparatus includes a housing, a magnetic device, and a shielding component. The housing includes a mounting position, a magnetic device includes an integrated part disposed at the mounting position, and a shielding component is disposed in the housing and surrounds a periphery of the mounting position.

21 Claims, 13 Drawing Sheets

(51) Int. Cl.
  *H01F 27/24* (2006.01)
  *H01F 27/30* (2006.01)
  *H05K 9/00* (2006.01)

(52) U.S. Cl.
  CPC ....... *H01F 27/306* (2013.01); *H05K 7/20272* (2013.01); *H05K 9/0037* (2013.01)

(58) Field of Classification Search
  USPC .......................................... 361/799, 816, 818
  See application file for complete search history.

(56) References Cited

U.S. PATENT DOCUMENTS

| | | |
|---|---|---|
| 2010/0065352 A1 | 3/2010 | Ichikawa |
| 2017/0368947 A1 | 12/2017 | Kume et al. |
| 2018/0309176 A1 | 10/2018 | Moschet et al. |
| 2019/0243431 A1 | 8/2019 | You et al. |
| 2019/0245430 A1* | 8/2019 | You ........................ H02M 7/003 |

FOREIGN PATENT DOCUMENTS

| | | |
|---|---|---|
| CN | 103490463 A | 1/2014 |
| CN | 204066964 U | 12/2014 |
| CN | 104993274 A | 10/2015 |
| CN | 204795954 U | 11/2015 |
| CN | 106208529 A | 12/2016 |
| CN | 206678822 U | 11/2017 |
| CN | 207070444 U | 3/2018 |
| CN | 108461160 A | 8/2018 |
| CN | 208271704 U | 12/2018 |
| CN | 208782595 U | 4/2019 |
| CN | 209982915 U | 1/2020 |
| CN | 209982981 U | 1/2020 |
| CN | 210805743 U | 6/2020 |
| CN | 108173416 B | 5/2021 |
| DE | 102013213233 A1 | 1/2015 |
| EP | 2830073 A1 | 1/2015 |
| WO | 2013/011626 A1 | 1/2013 |
| WO | 2018071758 A1 | 4/2018 |
| WO | 2019/242966 A1 | 12/2019 |

* cited by examiner

VEHICLE-MOUNTED POWER SUPPLY APPARATUS AND VEHICLE HAVING SAME

CROSS-REFERENCE TO RELATED APPLICATIONS

This application is a National Phase Application of International Patent Application No. PCT/CN2021/104082 filed with the China National Intellectual Property Administration (CNIPA) on Jul. 1, 2021, which is based on and claims priority to and benefits of Chinese Patent Application No. 202010658596.X, filed on Jul. 9, 2020 and entitled "VEHICLE-MOUNTED POWER SUPPLY APPARATUS AND VEHICLE HAVING SAME". The entire content of all of the above-identified applications is incorporated herein by reference.

FIELD

The present disclosure relates to the field of vehicle technologies, and specifically to a vehicle-mounted power supply apparatus and a vehicle having same.

BACKGROUND

In related technologies, as a vehicle-mounted power supply adopts a planar design, the internal structure of the vehicle-mounted power supply is more complex and is prone to the interference by external signals, reducing the operating efficiency of the vehicle-mounted power supply.

SUMMARY

The present disclosure resolves at least one of the technical problems in the related art. Therefore, the present disclosure proposes a vehicle-mounted power supply apparatus.

The present disclosure further provides a vehicle. The vehicle includes the vehicle-mounted power supply apparatus.

A vehicle-mounted power supply apparatus according to an embodiment of the present disclosure includes: a housing, a magnetic device, and a shielding component. A mounting position is arranged in the housing. The magnetic device is an integrated part and is arranged at the mounting position. The shielding component is arranged in the housing, and the shielding component surrounds a periphery of the mounting position.

In the vehicle-mounted power supply apparatus according to the embodiments of the present disclosure, the integrated design of the magnetic device can be easily realized by mounting the magnetic device at the mounting position, and then the shielding component is used to shield the interference of external signals to protect the magnetic device, thereby improving the stability and safety of the operation of the vehicle-mounted power supply apparatus.

In some embodiments, a coolant channel is defined in the shielding component, and the coolant channel surrounds a periphery of the magnetic device.

In some embodiments, the shielding component includes: a liquid passage member and a shielding wall. The coolant channel is defined in the liquid passage member. The shielding wall is separated from the liquid passage member, and the shielding wall is located on a side of the liquid passage member away from the magnetic device.

In some embodiments, one side of the coolant channel is provided with an opening, and the shielding component further includes a liquid passage cover plate and a sealing ring. The liquid passage cover plate is hermetically connected with the liquid passage member to close the opening. The sealing ring is sandwiched between the liquid passage cover plate and the liquid passage member.

In some embodiments, the liquid passage member includes a first sidewall and a second sidewall separated from the first sidewall, the coolant channel is defined between the first sidewall and the second sidewall, the first sidewall faces toward the magnetic device, the second sidewall is located on a side of the first sidewall away from the magnetic device, and a distance between the first sidewall and the second sidewall gradually increases in a direction toward the opening.

In some embodiments, the vehicle-mounted power supply apparatus further includes: a circuit board, a plurality of power switch tubes, and a fixing apparatus. Each of the power switch tubes is respectively electrically connected with the circuit board. The fixing apparatus is configured for simultaneously fixing the plurality of power switch tubes between the liquid passage member and the shielding wall.

In some embodiments, the fixing apparatus includes: a fixing plate and a plurality of elastic pieces. Each of the elastic pieces is configured for fixing one power switch tube. One end of each of the elastic pieces is fixed to the fixing plate, and the other end of each of the elastic pieces is located at one side of the fixing plate in a thickness direction and is separated from a surface on the one side of the fixing plate in the thickness direction.

In some embodiments, each of the elastic pieces includes: a fixing segment, a connection segment, and a pressing segment. The fixing segment is fixed on the fixing plate. The connection segment is connected between the fixing segment and the pressing segment. The pressing segment includes a first pressing portion and a second pressing portion. One end of the first pressing portion is connected with the connection segment, and the other end of the first pressing portion extends away from the fixing plate. One end of the second pressing portion is connected with the other end of the first pressing portion, and the other end of the second pressing portion extends toward the fixing plate.

In some embodiments, at least one boss is arranged on the other side of the fixing plate in the thickness direct and a cross-sectional area of the boss gradually decreases in a direction away from the fixing plate. The boss is formed by a part of the surface on the one side of the fixing plate in the thickness direction protruding toward a surface on the other side of the fixing plate in the thickness direction.

In some embodiments, an edge of the fixing plate is provided with at least one pull lug extending away from a center of the fixing plate. The fixing apparatus further includes: at least one pull lug piece, where the pull lug piece is arranged on one side of the pull lug in a thickness direction; and an edge of the fixing plate is provided with at least one fixing lug, and a free end of the fixing lug extends toward the other side of the fixing plate along the thickness direction of the fixing plate.

In some embodiments, the magnetic device includes: a magnetic core, a coil, a skeleton, a wire nose, and a nut. The coil is wound on the magnetic core and has a pin. the skeleton is arranged on the magnetic core. The wire nose is mounted on the skeleton and connected with the pin, and the wire nose has a connecting hole. The nut is mounted on the skeleton, and the nut has a threaded hole corresponding to a position of the connecting hole.

In some embodiments, the wire nose is movably mounted on the skeleton to make a distance between the connecting hole and the skeleton adjustable. The wire nose includes: a plate portion, a bending portion, and a clamping portion. The connecting hole is formed in the plate portion, and the nut is arranged between the plate portion and the skeleton. One end of the bending portion is connected to the plate portion, the bending portion protrudes to yard the skeleton, the bending portion is movably mounted on the skeleton, and the bending portion is configured as a U shape protruding toward the skeleton to form a groove. The clamping portion is connected to the other end of the bending portion and clamps the pin, and the clamping portion is located in the groove.

In some embodiments, the skeleton is provided with an anti-rotation groove, the nut is arranged in the anti-rotation groove, and a distance between the plate portion and a bottom wall of the anti-rotation groove is greater than an axial length of the nut.

In some embodiments, the wire nose further includes a positioning protrusion, where the positioning protrusion and the bending portion are respectively connected to two opposite side edges of the plate portion, the skeleton is provided with a positioning groove, and the positioning protrusion is engaged with the positioning groove.

In some embodiments, the vehicle-mounted power supply apparatus further includes a magnetic circuit piece and at least one magnetic sheet. The magnetic core and the skeleton are carried on the magnetic circuit piece. The magnetic sheet is mounted on the skeleton, the magnetic sheet and the magnetic circuit piece are respectively arranged on two opposite sides of the magnetic core, the skeleton is provided with a hook, and the hook is hooked to an edge of the magnetic sheet.

A vehicle according to an embodiment of the present disclosure includes the vehicle-mounted power supply apparatus described above.

The additional aspects and advantages of the present disclosure will be provided in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible from the following descriptions of the embodiments with reference to the accompanying drawings.

Figure 1:
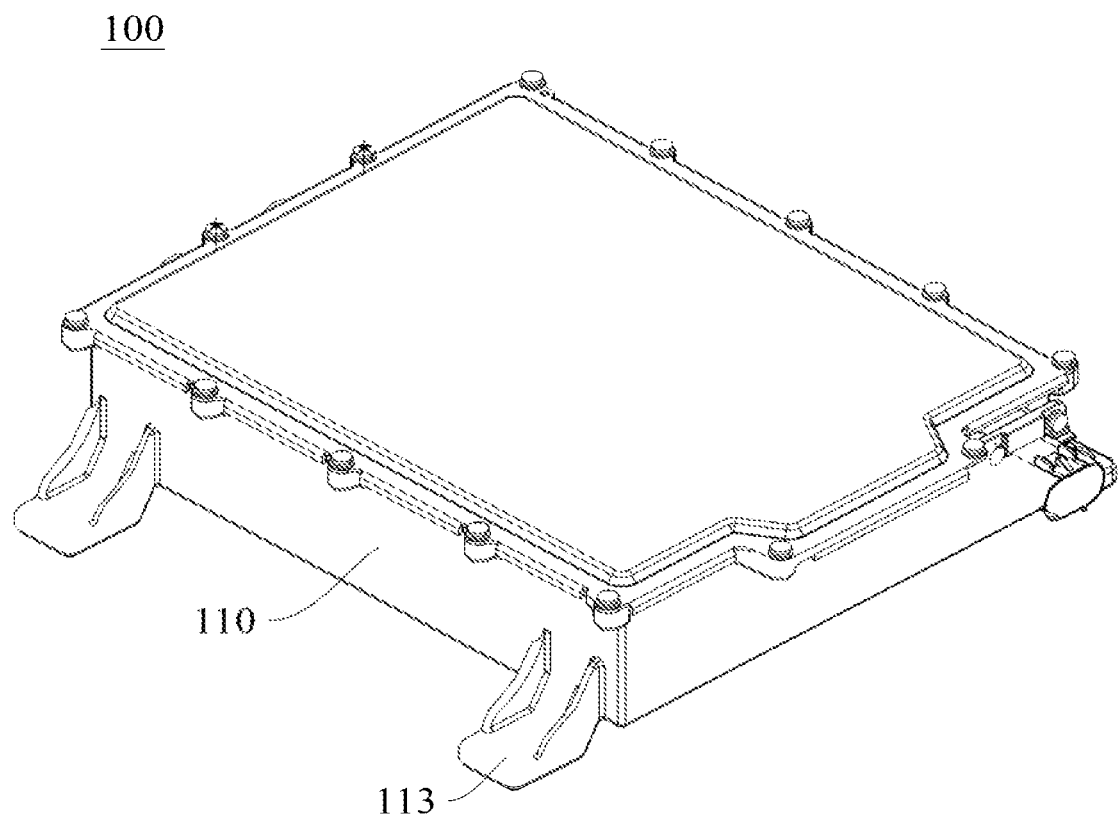
FIG. 1 is a schematic diagram of a vehicle-mounted power supply apparatus according to at embodiment of the present disclosure.

LIST OF REFERENCE NUMERALS vehicle-mounted power supply apparatus 100,
housing 110, mounting position 111, mounting groove 112, support 113,
magnetic device 120,
shielding component 130, coolant channel 131, liquid passage member 132, first segment 1321, second segment 1322, first sidewall 1323, second sidewall 1324, shielding wall 133, liquid passage cover plate 134, sealing ring 135,
thermal insulation layer 151, fixing apparatus 152,
coil 300, pin 310,
skeleton 400, assembly slot 410, anti-rotation groove 420, hook 430, positioning groove 440,
wire nose 500, connecting hole 510, plate portion 520, bending, portion 530, groove 531, clamping portion 540, positioning protrusion 550,
nut 600, threaded hole 610,
magnetic sheet 700, supporting portion 800, magnetic circuit piece 801,
fixing plate 1, elastic piece 2,
fixing segment 21, connection segment 22, pressing segment 23,
first pressing portion 231, second pressing portion 232,
fixing lug 3, boss 4, pull lug 5, pull lug piece 51,
chamfer 121,
guide surface 2013, power switch tube 202, and
vehicle 1000.

DETAILED DESCRIPTION

The embodiments of the present invention are described in detail below, and the embodiments described with reference to accompanying drawings are exemplary.

A vehicle-mounted power supply apparatus 100 according to an embodiment of the present disclosure will be described below with reference to FIG. 1 to FIG. 5, which includes: a housing 110, a magnetic device 120, and a shielding component 130. The vehicle-mounted power supply apparatus 100 has a simple structure, good heat dissipation, and a high operating efficiency.

In an embodiment, a mounting position 111 is arranged in the housing 110, and the magnetic device 120 is an integrated part and is arranged at the mounting position 111. It should be Doted that by arranging the mounting position 111 inside the housing 110, the magnetic device 120 may be centrally arranged at the mounting position 111, thereby improving the integration degree of the vehicle-mounted power supply apparatus 100. The shielding component 130 is arranged in the housing 110, and the shielding component 130 surrounds a periphery of the mounting position 111. The shielding component 130 can be used to shield electromagnetic signals, thereby protecting the magnetic device 120.

In the vehicle-mounted power supply apparatus 100 according to the embodiments of the present disclosure, the integrated design of the magnetic device 120 can be easily realized by mounting the magnetic device 120 at the mounting position 111, and then the shielding component 130 is used to shield the interference of external signals to protect the magnetic device 120, thereby improving the stability and safety of the operation of the vehicle-mounted power supply apparatus 100.

Figure 3:
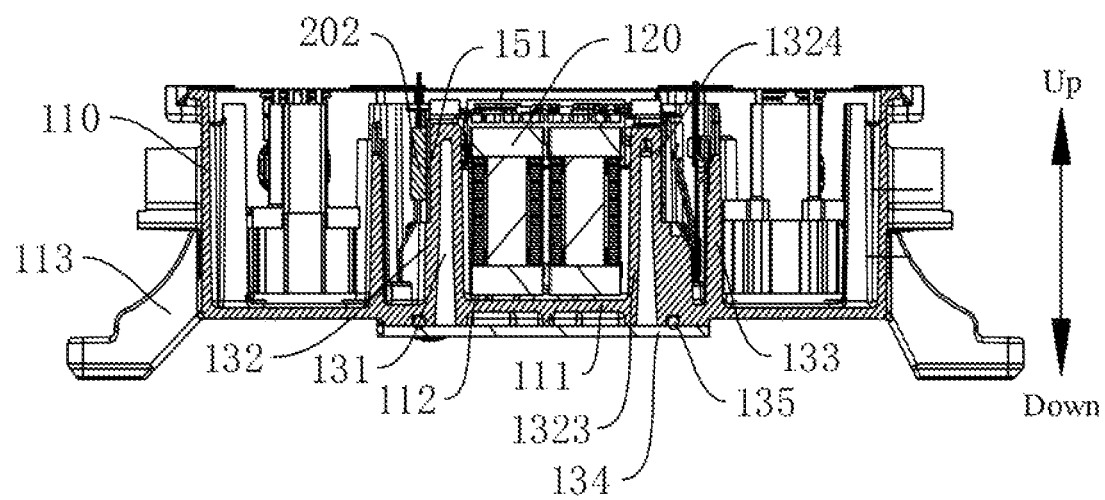
FIG. 3 is a cross-sectional view of a vehicle-mounted power supply apparatus according to an embodiment of the present disclosure.
Figure 4:
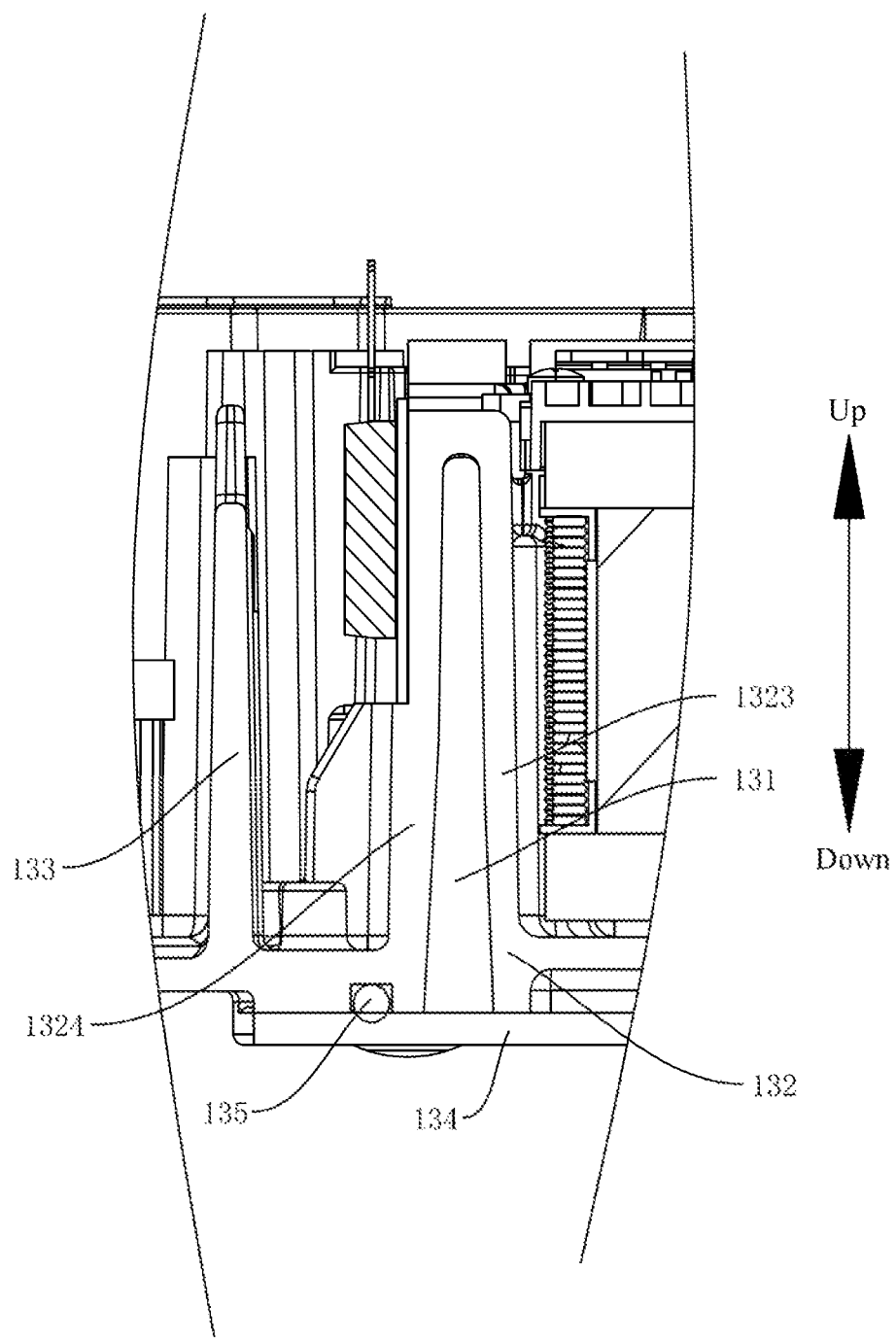
FIG. 4 is a partial cross-sectional view of a vehicle-mounted power supply apparatus according to art embodiment of the present disclosure.

In the embodiment shown in FIG. 3 and FIG. 4, a coolant channel 131 is defined in the shielding component 130, and the coolant channel 131 surrounds a periphery of the magnetic device 120. It should be noted that, the coolant channel 131 may be provided with a coolant. When the coolant flows, heat exchange occurs between the coolant near the magnetic device 120 and the magnetic device 120, that is, the coolant can cool the magnetic device 120. The flow of the coolant can take away heat generated by the magnetic device 120, so as to cool and dissipate heat from the magnetic device 120. By arranging the coolant channel 131 to surround the periphery of the magnetic device 120, the coolant channel 131 can be close to more positions on the magnetic device 120, thereby improving the cooling efficiency of the coolant channel 131.

As shown in FIG. 3 and FIG. 4, the shielding component 130 may include a liquid passage member 132 and a shielding wall 133. The coolant channel 131 is defined in the liquid passage member 132. The shielding wall 133 separated from the liquid passage member 132, and the shielding wall 133 is located on a side of the liquid passage member 132 away from the magnetic device 120. It can be understood that, the liquid passage member 132 is closer to the magnetic device 120 than the shielding wall 133, that is, the liquid passage member 132 is arranged adjacent to the magnetic device 120, thereby facilitating the cooling of the magnetic device 120 by the coolant channel 131. By arranging the shielding wall 133 around the liquid passage member 132, the magnetic device 120 and the liquid passage member 132 can be protected at the same time.

Figure 2:
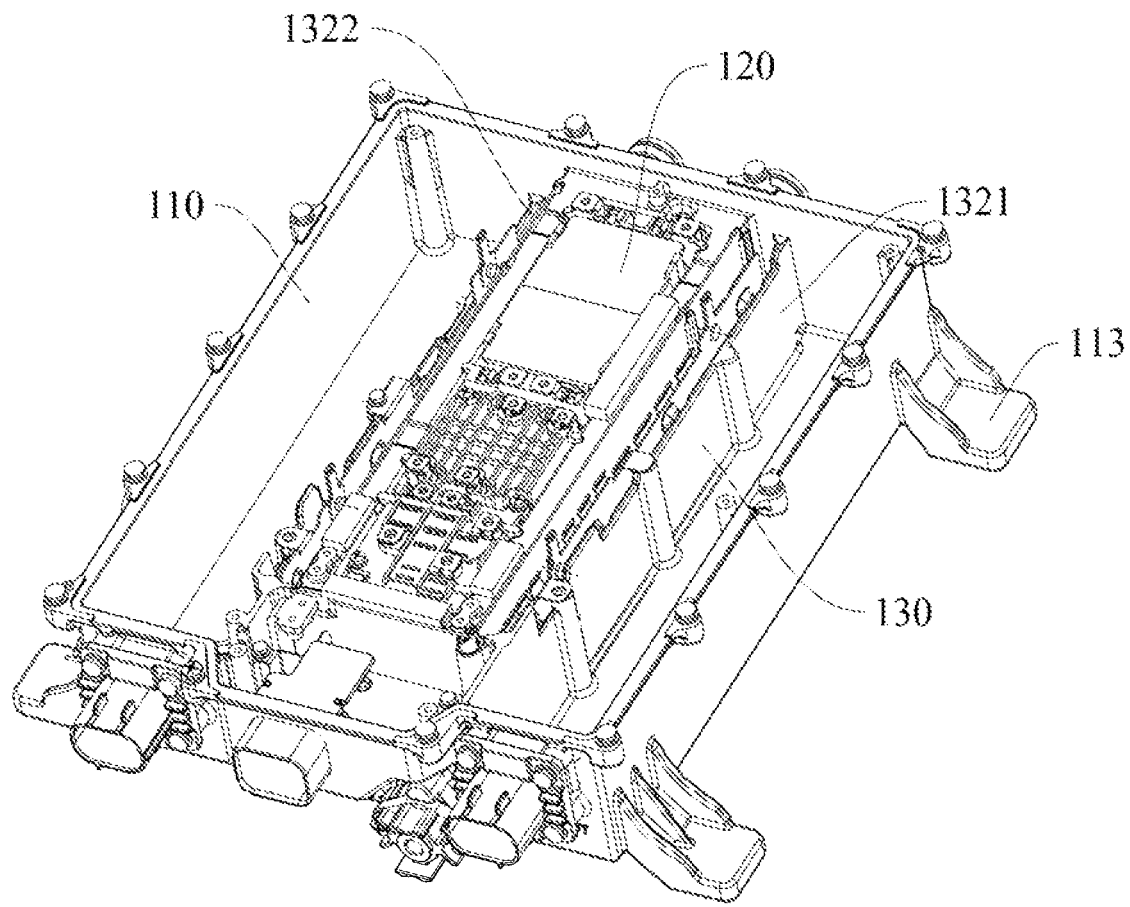
FIG. 2 is a three-dimensional diagram of a vehicle-mounted power supply apparatus according to an embodiment of the present disclosure.

As shown in FIG. 2, according to some embodiments of the present disclosure, the liquid passage member 132 may include a first segment 1321 and a second segment 1322 separated from the first segment 1321, and the magnetic device 120 is sandwiched between the first segment 1321 and the second segment 1322. It can be understood that the first segment 1321 is located on one side of the magnetic device 120, and the second segment 1322 is located on the other side of the magnetic device 120, so as to dissipate heat from the magnetic device 120 from multiple directions. In addition, the liquid passage member 132 arranged on two sides of the magnetic device 120 can limit the magnetic device 120, thereby improving the assembly stability of the magnetic device 120.

As shown in FIG. 3 and FIG. 4 in some embodiments, one side of the coolant channel 131 is provided with an opening, and the shielding component 130 further includes a liquid passage cover plate 134. The liquid passage cover plate 134 is hermetically connected with the liquid passage member 132 to close the opening. Therefore, on the one hand, it is convenient to fill the coolant into the coolant channel 131. On the other hand, the liquid passage cover plate 134 can be used to seal the opening, thereby simplifying the structure of the liquid passage member 132 and facilitating the replacement and maintenance of the liquid passage member 132.

In some embodiments, the liquid passage cover plate 134 is welded to the liquid passage member 132, or the liquid passage cover plate 134 is connected to the liquid passage member 132 by a screw. In this way, the liquid passage cover plate 134 and the liquid passage member 132 can be fixed by welding or by a bolt connection. When the liquid passage cover plate 134 and the liquid passage member 132 are connected by welding, a coolant with a high heat exchange effect may be used to extend the heat dissipation effect of the liquid passage member 132, and at the same time, the liquid passage member 132 can also have a higher stability and avoid coolant leakage.

When the liquid passage cover plate 134 and the liquid passage member 132 are connected and fixed by a screw, the coolant that exchanges heat in the coolant channel 131 has a higher use effect, thereby increasing the heat dissipation effect of the liquid passage member 132. In addition, the liquid passage cover plate 134 and the liquid passage member 132 connected by a bolt have good detachable performance, which not only improves the assembly efficiency of the liquid passage member 132, but also facilitates the disassembly of the liquid passage member 132. This improves the assembly and disassembly efficiency of the liquid passage member 132, and facilitates the use, maintenance, and repair of the vehicle-mounted power supply apparatus 100.

Referring to FIG. 3 and FIG. 4, in some embodiments, the shielding component 130 further includes a sealing ring 135. The sealing ring 135 is sandwiched between the liquid passage cover plate 134 and the liquid passage member 132. Therefore, the sealing ring 135 arranged between the liquid passage cover plate 134 and the liquid passage member 132 provides a better sealing performance for the coolant channel 131 on the liquid passage member 132, which can further avoid the liquid leakage and other situations, and further increase the usage reliability of the coolant channel 131. In addition, the sealing ring 135 sandwiched between the liquid passage cover plate 134 and the liquid passage member 132 can facilitate the assembly of the liquid passage cover plate 134 and improve the assembly efficiency of the liquid passage cover plate 134. In addition, when the liquid passage cover plate 134 is to be disassembled, the sealing ring 135 can reduce the adhesion resistance between the liquid passage cover plate 134 and the liquid passage member 132, so that the disassembly convenience of the liquid passage cover plate 134 can be improved, thereby further facilitating the use, maintenance, and repair of the vehicle-mounted power supply apparatus 100.

In the embodiment shown in FIG. 3 and FIG. 4, the liquid passage member 132 may include a first sidewall 1323 and a second sidewall 1324 separated from the first sidewall 1323. The coolant channel 131 is defined between the first sidewall 1323 and the second sidewall 1324. The first sidewall 1323 faces toward the magnetic device 120. The second sidewall 1324 is located on a side of the first sidewall 1323 away from the magnetic device 120. A distance between the first sidewall 1323 and the second sidewall 1324 gradually increases in a direction toward the opening.

In this way, the coolant channel 131 is defined to be narrow in the upper part and wide in the lower part, so as to facilitate the demolding of the liquid passage member 132 and improve the yield of the liquid passage member 132. In addition, the first sidewall 1323 facing toward the magnetic device 120 can better exchange heat with the magnetic device 120 to improve the cooling efficiency of the liquid passage member 132, thereby improving the operating efficiency of the vehicle-mounted power supply apparatus 100.

Figure 5:
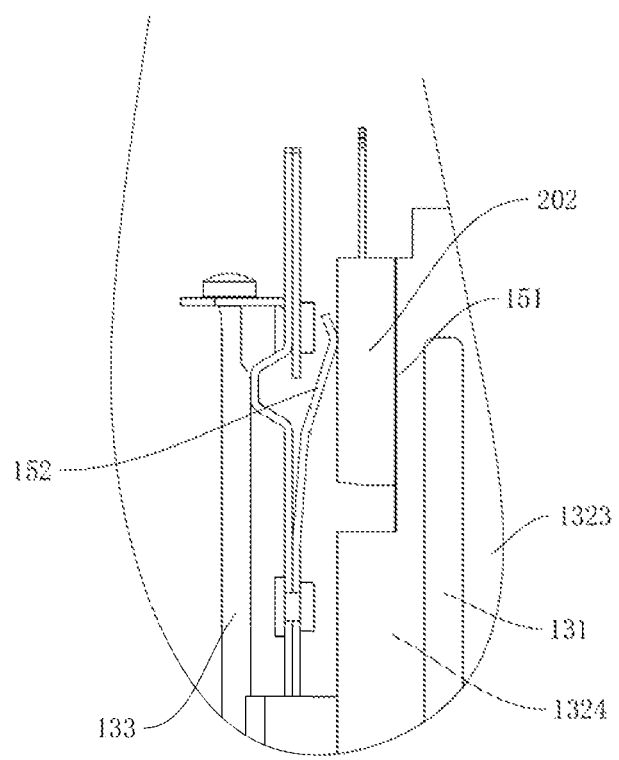
FIG. 5 is a partial cross-sectional view of a vehicle-mounted power supply apparatus according to an embodiment of the present disclosure.

As shown in FIG. 5, in some embodiments, the vehicle-mounted power supply apparatus 100 further includes: a circuit board (not shown), power switch tubes 202, and a fixing apparatus. The power switch tubes 202 are electrically connected with the circuit board. The power switch tubes 202 are arranged between the liquid passage member 132 and the shielding wall 133. The fixing apparatus 152 is configured for simultaneously fixing a plurality of power switch tubes 202 between the liquid passage member 132 and the shielding wall 133.

The power switch tubes 202 can control on/off of a circuit on die circuit board. Therefore, the arrangement of the power switch tubes 202 on the shielding wall 133 can not only enable the shielding wall 133 to better support the power switch tubes 202 and enable the power switch tubes 202 to better control on/off of the circuit on the circuit board, but also enable the shielding wall 133 to shield the interference of external signals on the power switch tubes 202, allowing the power switch tubes 202 to control the circuit board more precisely.

In addition, the fixing apparatus 152 is further arranged on an outer side of the power switch tube 202. The fixing apparatus 152 has a function of press-fitting the power switch tube 202. The fixing apparatus 152 deforms during the press-fit process, and the deformed fixing apparatus 152 has an axial pressure, which presses the power switch tube 202 and the liquid passage member 132 together, thereby providing the lower switch tube 202 with a high stability. In addition, after the fixing apparatus 152 is arranged to fix the power switch tube 202, the fixing apparatus 152 also has a good heat exchange capacity, so that the heat generated by the power switch tube 202 during the operation can be transferred through the fixing apparatus 152, to lower the operating temperature of the power switch tube 202 and improve the operating efficiency of the power switch tube 202. In addition, the fixing apparatus 152 can fix a plurality of power switch tubes 202 at a time, achieving a high fixing efficiency. In addition, the fixing process of the fixing apparatus 152 can also be simplified to improve the assembly efficiency of the vehicle-mounted power supply apparatus 100.

The fixing apparatus 152 for power switch tubes 202 according to the embodiments of the present disclosure will be described below with reference to FIG. 11 to FIG. 15.

It should be noted that, the fixing apparatus 152 fixes the power switch tube 202 to the liquid passage member 132 of the shielding component 130. In an embodiment, the power switch tube 202 is bonded with and against the second sidewall 1324, so that the fixing apparatus 152 squeezes the power switch tube 202 to the second sidewall 1324. The second sidewall 1324 provides support for the power switch tube 202. In addition, the power switch tube 202 can transfer the heat generated during the operation to the second sidewall 1324 to reduce the operating temperature of the power switch tube 202 and improve the operating efficiency of the power switch tube 202. The first sidewall 1323 of the liquid passage member 132 is located at the side away from the power switch tube 202, and can absorb the heat emitted by the magnetic device 120 during the operation. The shielding component 130 further includes the shielding wall 133. The shielding wall 133 is located on the other side away from the power switch tube 202 and can shield external interference signals, including interference signals to the power switch tube 202 and interference signals to the magnetic device 120 inside the power switch rube 202. This embodiment only introduces the bonding, contacting and interaction of the power switch tribe 202 with the second sidewall 1324 under the action of the fixing apparatus 152. The first sidewall 323 and the shielding wall 133 have been introduced in the context, and will not be repeated here.

Figure 11:
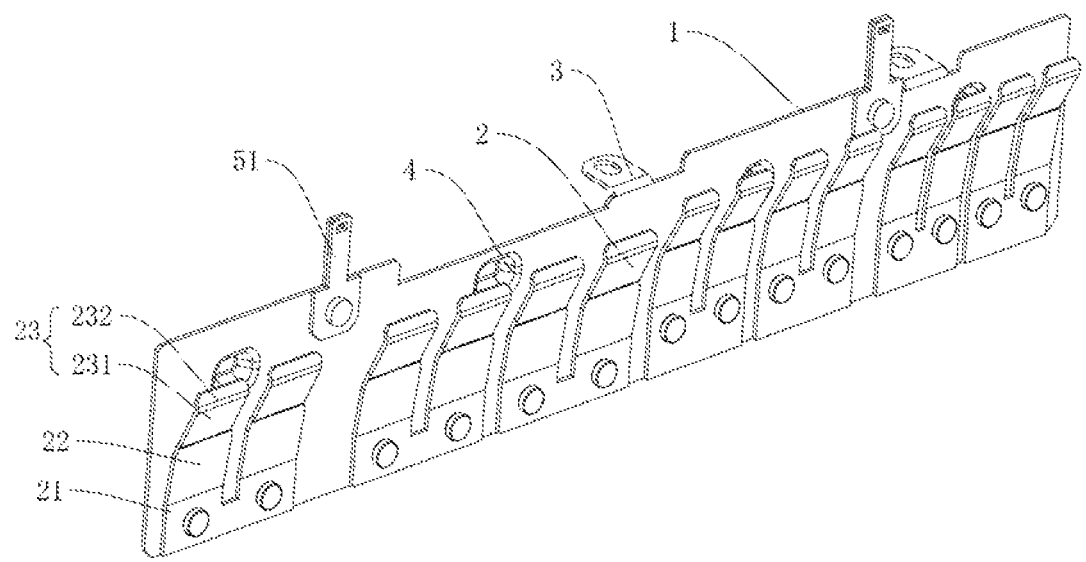
FIG. 11 is a three-dimensional diagram of a fixing apparatus for power switch tubes according to an embodiment of the present disclosure.
Figure 12:
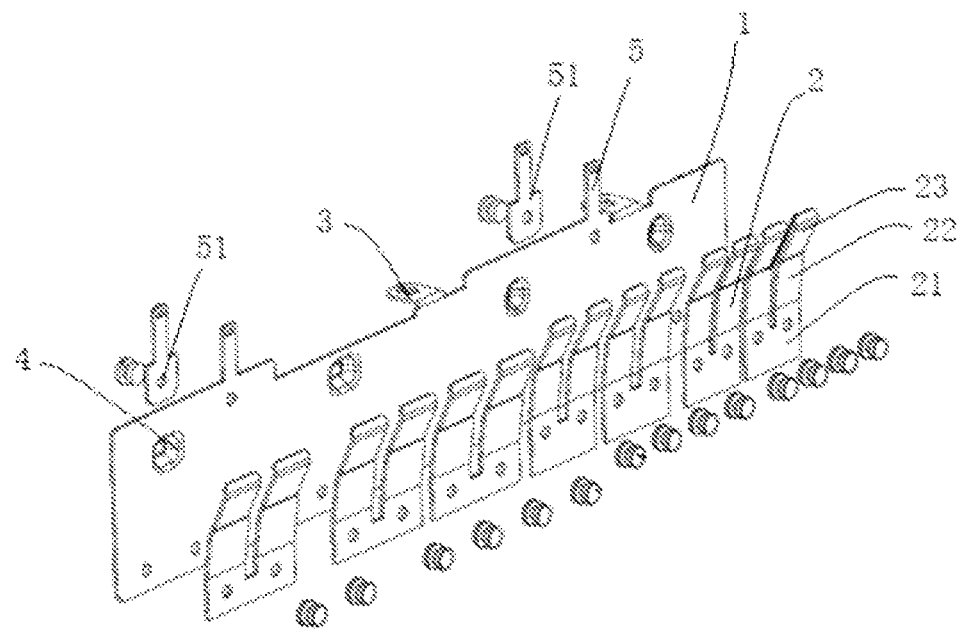
FIG. 12 is an exploded view of the fixing apparatus shown in FIG. 11.
Figure 13:
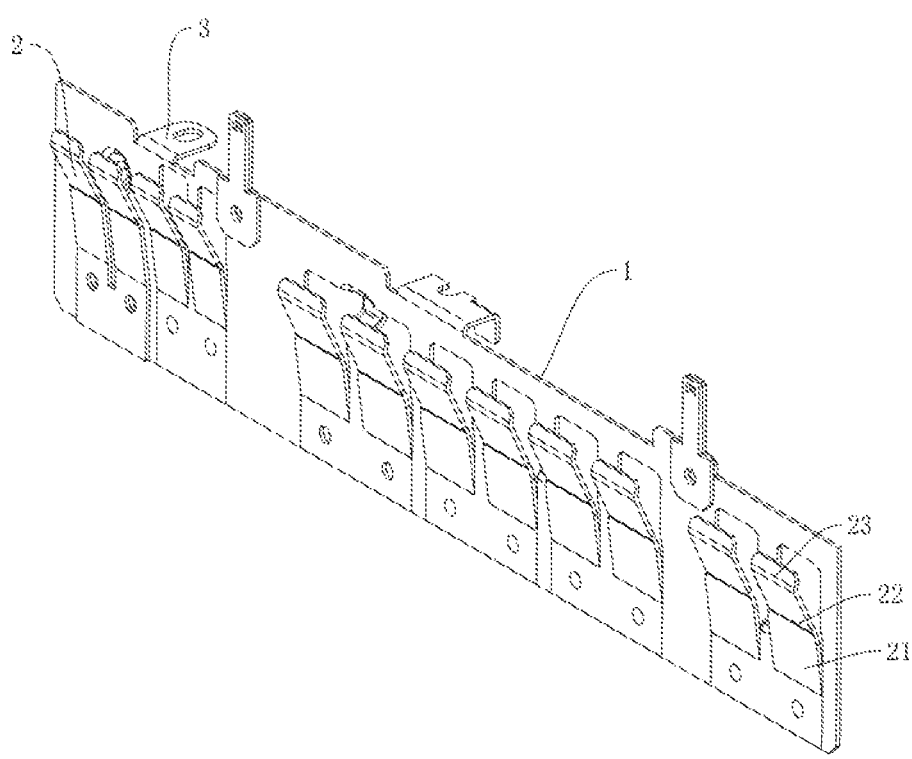
FIG. 13 is a three-dimensional diagram of a fixing apparatus for power switch tubes according to an embodiment of the present disclosure.

As shown in FIG. 11 to FIG. 13, the fixing apparatus 152 for power switch tubes 202 according to an embodiment of the present disclosure includes a fixing plate 1 and a plurality of elastic pieces 2.

In an embodiment, each elastic piece 2 is used to fix one power switch tube 202, and one end of each elastic piece 2 (for example, a lower end in FIG. 11) is fixed to the fixing plate 1. In this case, the one end of each elastic piece 2 is fixed relative to the fixing plate 1. The other end of each elastic piece 2 (for example, an upper end in FIG. 11) is located on one side of the fixing plate 1 in the thickness direction, and the other end of each elastic piece 2 is separated from a surface on the one side of the fixing plate 1 in the thickness direction.

Figure 14:
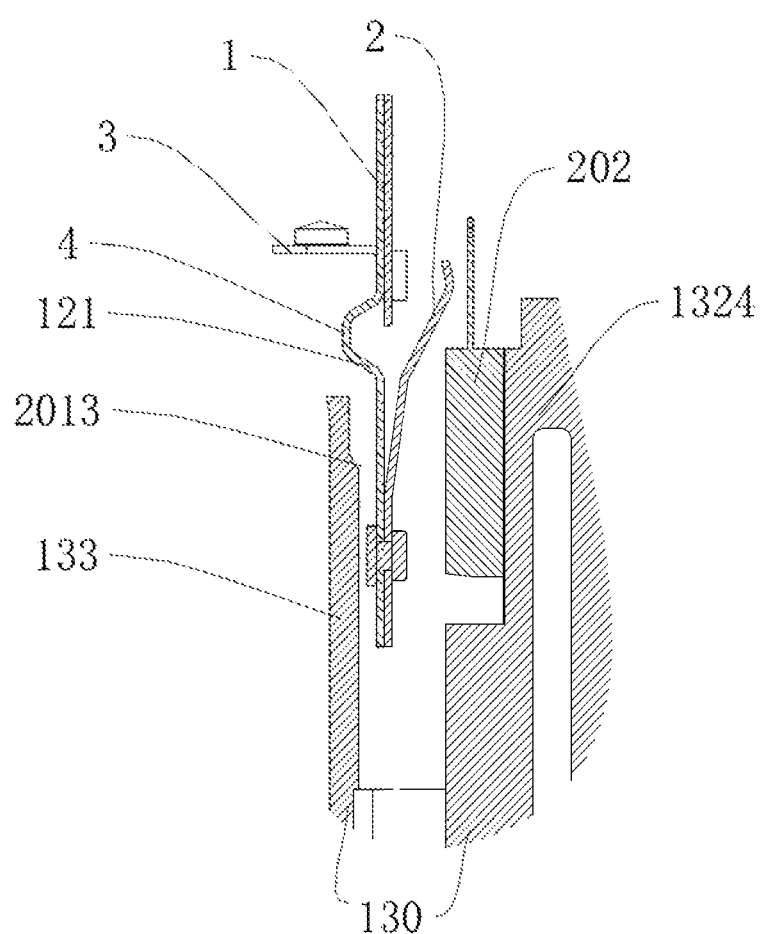
FIG. 14 is a cross-sectional view of a switch tube assembly according to an embodiment of the present disclosure before power switch tubes are press-fit.
Figure 15:
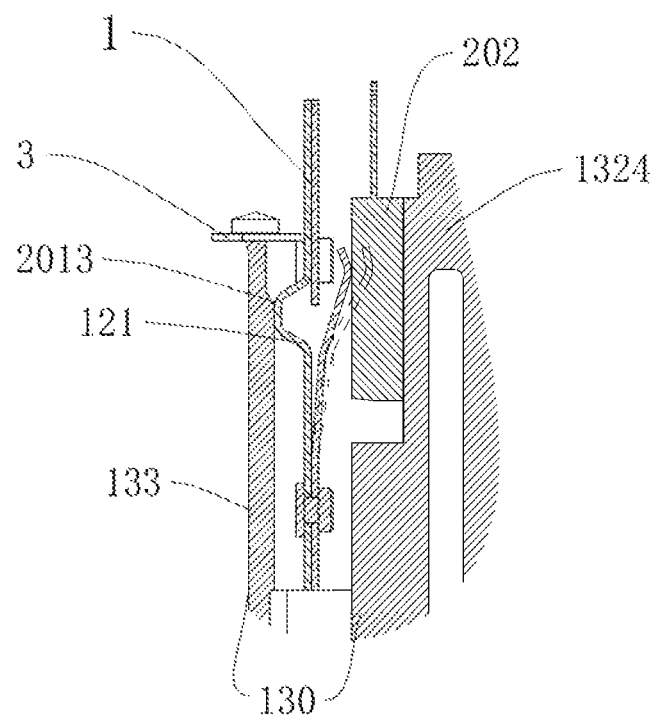
FIG. 15 is cross-sectional view of the switch tube assembly shown in FIG. 14 after the power switch tubes are press-fit.
Figure 16:
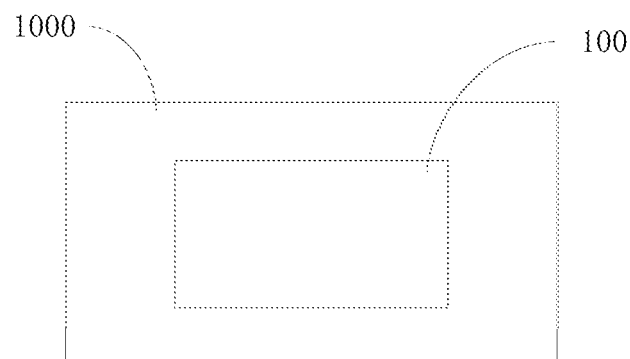
FIG. 16 is a block diagram of a vehicle according to an embodiment of the present disclosure.

When the fixing apparatus 152 for power switch tubes 202 is applied to a switch tube assembly 200, with reference to FIG. 14 and FIG. 15, in order to make the plurality of power switch tubes 202 closely fit on an inner wall of the shielding component 130, such as the second sidewall 1324, where the plurality of power switch tubes 202 are mounted, the operation personnel only needs to insert the fixing plate 1 having the plurality of elastic pieces into the shielding component 130. In the above process, the other ends of the plurality of elastic pieces 2 can move toward the fixing plate 1 under the action of the corresponding power switch tithes 202, and due to an elastic force of the elastic piece 2 itself, the other ends of the plurality of elastic pieces 2 can respectively apply a force toward the second sidewall 1324 to the corresponding power switch tubes 202, thereby tightly pressing the plurality of power switch tubes 202 onto the second sidewall 324. This enables the plurality of power switch tubes 202 to closely fit with the second sidewall 1324, thereby realizing effective heat dissipation for the plurality of power switch tubes 202 and prolonging the service life of the plurality of power switch tubes 202. Therefore, compared with the related art in which each power switch tube 202 requires the use of a corresponding screw to lock the elastic piece 2 to achieve press-fit and fixation, the fixing apparatus 152 including the fixing plate 1 and the plurality of elastic pieces 2 is an integral structure, which can press-fit a plurality of power switch tubes 202 at a time, thereby simplifying the assembly process, improving the assembly efficiency, and facilitating subsequent disassembly. The disassembly can be done at a time.

The fixing apparatus 152 for power switch tubes 202 according to the embodiments of the present disclosure include the fixing plate 1 and the plurality of elastic pieces 2, where one end of each elastic piece 2 is fixed to the fixing plate 1, the other end of each elastic piece 2 is located on one side of the fixing plate 1 in the thickness direction and is separated from the surface on the one side of the fixing plate 1 in the thickness direction. The fixing apparatus 152 has a simple structure. When the fixing apparatus 152 is applied to the switch tube assembly 200, the assembly efficiency of the fixing apparatus 132 is high.

As shown in FIG. 11, each elastic piece 2 includes a fixing segment 21, a pressing segment 23, and a connection segment 22. The fixing segment 21 is fixed on the fixing plate 1, and each elastic piece 2 is fixedly connected to the fixing plate 1 through the fixing segment 21. The pressing segment 23 is located on the one side of the fixing plate 1 in the thickness direction, and the pressing segment 23 is separated from the surface on the one side of the fixing plate 1 in the thickness direction. When the fixing apparatus 152 is applied to the switch tube assembly 200, each elastic piece 2 can tightly press the corresponding power switch rube 202 through the pressing segment 23 to fit with the inner wall of the shielding component 130, such as the second sidewall 1324. The connection segment 22 is connected between the fixing segment 21 and the pressing segment 23. In this way, it can be effectively ensured that each elastic piece 2 has a sufficient elasticity, so that the power switch tube 202 can be reliably and tightly pressed in the shielding component 130.

Referring to FIG. 11, the pressing segment 23 includes a first pressing portion 231 and a second pressing portion 232, One end of the first pressing portion 231 (for example, a lower end in FIG. 11) is connected with the connection segment 22, and the other end of the first pressing portion 231 (for example, an upper end in FIG. 11) extends away from the fixing plate 1. One end of the second pressing portion 232 (for example, a lower end in FIG. 11) is connected with the other end of the first pressing portion 231, and the other end of the second pressing portion 232 (for example, an upper end in FIG. 11) extends toward the fixing plate 1. In this case, the connection between the first pressing portion 231 and the second pressing portion 232 is suitable for abutting the power switch tube 202. Therefore, by arranging the pressing segment 23 to include the first pressing portion 231 and the second pressing portion 232, the fixing apparatus 152 can be more smoothly mounted into the shielding component 130, and the end of the pressing segment 23 is not easy to contact the power switch tube 202 directly, thereby extending the service life of the power switch tube 202. In an embodiment, there nay be a smooth transition between the first pressing portion 231 and the second pressing portion 232. In this way, the contact area between the pressing segment 23 and the power switch tube 202 can be increased, and the force exerted by the pressing segment 23 on the power switch tube 202 can be more uniform, thereby effectively ensuring that the power switch tube 202 as a whole closely fits the second sidewall 1324, and providing a good heat dissipation effect.

In an embodiment, a length of the second pressing portion 232 may be less than that of the first pressing portion 231, to save materials while ensuring that the pressing portion has a sufficient force on the power switch tube 202, thereby reducing the costs.

Referring to FIG. 11 to FIG. 13 as well as FIG. 14 to 15, an angle between the first pressing portion 231 and the fixing plate 1 is greater than an angle between the connection segment 22 and the fixing plate 1. In this case, compared with the connection segment 22, an inclination angle of the first pressing portion 231 is greater, and there may be a smooth transition at the connection between the first pressing portion 231 and the connection segment 22. Through such an arrangement, each elastic piece 2 can be gradually extended away from the fixing plate 1, and the service life of the elastic piece 2 can be extended while ensuring a sufficient elastic force.

As shown in FIG. 11 to FIG. 12, the plurality of elastic pieces 2 constitute at least one elastic piece group. The elastic piece group includes at least two elastic pieces 2 arranged side by side. One end of each of the at least two elastic pieces 2 is fixed to the fixing plate 1, and the other ends of the at least two elastic pieces 2 are separated from each other. Such an arrangement is convenient for processing and can reduce the costs. For example, in an example of FIG. 11 and FIG. 12, seven elastic piece groups are shown. The seven elastic piece groups are arranged at intervals along a length direction of the fixing plate 1. Each elastic piece group includes two elastic pieces 2 arranged along the length direction of the fixing plate 1. Lower ends of the two elastic pieces 2 are connected, and upper ends of the two elastic pieces 2 are separated from each other for respectively abutting the corresponding power switch tubes 202. The at least two elastic pieces 2 in each elastic piece group may be integrally formed.

The seven elastic piece groups shown in FIG. 11 and FIG. 12 may include three first elastic piece groups and two second elastic piece groups. The length and width of the elastic piece 2 in each first elastic piece group may be different from the length and width of the elastic piece 2 in each second elastic piece group, so as to adapt to power switch tubes 202 of different sizes.

In an embodiment, each elastic piece 2 may be riveted (as shown in FIG. 11 and FIG. 12), welded (not shown) or threadedly connected (not shown) to the fixing plate 1. Therefore, the production process is simple. Of course, the present disclosure is not limited thereto, and the plurality of elastic pieces 2 may also be integrally formed with the fixing plate 1, as shown in FIG. 13. For example, the plurality of elastic pieces 2 may be formed from the fixing plate 1 by stamping.

According to some embodiments of the present disclosure, as shown in FIG. 12 to FIG. 15, at least one boss 4 is arranged on the other side of the fixing plate 1 in the thickness direction. The boss 4 protrudes from the surface on the other side of the fixing plate 1 in the thickness direction. In this way, when the fixing apparatus 152 is assembled into the shielding component 130, the boss 4 abuts against the shielding wall 133 opposite to the second sidewall 1324 in the shielding component 130. In this case, the boss 4 can be engaged with the elastic piece 2, so that the elastic piece 2 can exert a greater force on the power switch tube 202, so that the power switch tube 202 can be more closely fit to the second sidewall 1324 of the shielding component 130.

As shown in FIG. 14 and FIG. 15, a cross-sectional area of the boss 4 gradually decreases in a direction away from the fixing plate 1. In an embodiment, at least one side surface of the boss 4 may be formed as a chamfer 121, for example, at least a lower side surface of the boss 4 may be formed as a chamfer 121, so that the fixing apparatus 152 can be more smoothly assembled into the shielding component 130.

In an embodiment, referring to FIG. 11 to FIG. 12 as well as FIG. 13 to FIG. 14, the boss 4 may be formed by a part of the surface on the one side of the fixing plate 1 in the thickness direction protruding toward a surface of the other side of the fixing plate 1 in the thickness direction. For example, the boss 4 may be formed by stamping to simplify the fabrication process of the boss 4 and reduce the costs. Of course, the boss 4 may also be a solid structure arranged on the surface of the other side of the fixing plate 1 in the thickness direction.

According to some embodiments of the present disclosure, referring to FIG. 11 to FIG. 12, a plurality of bosses 4 may be arranged, and the plurality of bosses 4 are arranged at intervals along the arrangement direction of the plurality of elastic pieces 2. Therefore, the arrangement of the plurality of bosses 4 can effectively ensure that the plurality of elastic pieces respectively exert a large force on the corresponding power switch tubes 202. It can be understood that the number of bosses 4 may be less than the number of elastic piece 2, as long as it can ensure that the plurality of elastic pieces 2 can tightly press the corresponding power switch tubes 202 in the shielding component 130.

According, to some embodiments of the present disclosure, as shown in FIG. 12, an edge of the fixing plate 1 is provided with at least one pull lug 5 extending away from a center of the fixing plate 1. For example, in an example of FIG. 12, two pull lugs 5 are shown, and the two pull lugs 5 may be in the same plane with the fixing plate 1. When it is necessary to insert the fixing apparatus 152 into the shielding component 130, operation personnel may hold the two pull lugs 5 and insert the fixing apparatus 152 into the shielding component 130 from top to bottom, so that the plurality of elastic pieces 2 can closely fit with the second sidewall 1324 of the shielding component 130. When it is necessary to take out the fixing apparatus 152, the two pull lugs 5 may be pulled upward, so that the fixing apparatus 152 can be conveniently pulled out. Therefore, the assembly and disassembly of the fixing apparatus 152 can be more conveniently realized by arranging the pull lug 5.

The two pull lugs 5 shown in FIG. 11 to FIG. 12 are for the purpose of illustration. After reading the technical solution of the present disclosure, those of ordinary skill in the art can obviously understand that the application of this solution to technical solutions involving three or more pull lugs 5 also falls within the scope of protection of the present disclosure.

According to some embodiments of the present disclosure, as shown in FIG. 11 and FIG. 12, the fixing apparatus 152 may include at least one pull lug piece 51. The pull lug piece 51 is arranged on one side of the pull lug 5 in a thickness direction. For example, as shown in FIG. 12, the pull lug piece 51 may include a first segment and a second segment connected with each other, a length of the first segment of the pull lug piece 51 may be equal to a length of the pull lug 5, a width of the first segment of the pull lug piece 51 may be equal to a width of the pull lug 5, and a width of the second segment may be greater than the width of the first segment. During the assembly, the first segment of the pull lug piece 51 may correspond to the pull lug 5, and the second segment of the pull lug piece 51 may be fixed to the fixing plate 1 by riveting or welding. Therefore, the pull lug 5 can be reinforced by arranging the pull lug piece 51, thereby improving the structural strength of the pull lug 5. The number of pull lug pieces 51 may be equal to or less than the number of pull lugs 5. It can be understood that the actual number of pull lug pieces 51 may be set according to actual requirements to better meet the practical application.

According to some embodiments of the present disclosure, with reference to FIG. 11 and FIG. 14, an edge of the fixing plate 1 is provided with at least one fixing lug 3. Therefore, by arranging the fixing lug 3, the fixing apparatus 152 can be fixedly connected to the shielding component 130 through the fixing lug 3. A free end of the fixing lug 3 extends toward the other side of the fixing plate 1 along the thickness direction of the fixing plate 1. In this way, after the fixing apparatus 152 is assembled on the shielding component 130, the fixing lug 3 is located on the top of the shielding component 130, and the fixing lug 3 is exposed out of the shielding component 130. In this case, a threaded fastener may be passed through the fixing lug 3 and threadedly connected to the shielding compo 130, so the assembly is convenient. Compared with the related art in which an opening is provided at the bottom of the shielding component 130 or a large number of through holes are provided on the top circuit board, the fixing apparatus 152 requires less mounting space, and there is no need to reserve operation space required for fixing the fixing apparatus 152. In addition, the fixing lug 3 also has a positioning function. In an embodiment, when the fixing lug 3 is assembled to contact the top of the shielding component 130, it indicates that the fixing apparatus 152 has been mounted in place. In this case, the elastic piece 2 makes the power switch tube 202 closely fit with the second sidewall 1324 of the shielding component 130.

As shown in FIG. 14 and FIG. 15, the switch tube assembly 200 according to an embodiment of the present disclosure includes a shielding component 130, a plurality of power switch tubes 202, and a fixing apparatus 152. The fixing apparatus 152 is the fixing apparatus 152 for power switch tubes 202 according to the above embodiments of the present disclosure.

In an embodiment, the plurality of power switch tubes 202 are all arranged in the shielding component 130. The fixing apparatus 152 is arranged in the shielding component 130, and the other ends of the plurality of elastic pieces 2 of the fixing apparatus 152 tightly press the plurality of power switch tubes 202 in the shielding component 130.

For the switch tube assembly 200 according to the embodiment of the present disclosure, by using the above fixing apparatus 152, the fixing apparatus 152 can be conveniently assembled into the shielding component 130, so the assembly is convenient. Moreover, the plurality of power switch tubes 202 can be abutted against the second sidewall 1324 in the shielding component 130 under the action of the plurality of elastic pieces 2, which can better realize the heat dissipation and extend the service life of the power switch tubes 202.

According to some embodiments of the present disclosure, referring to FIG. 14 and FIG. 15, at least one boss 4 is arranged on the other side of the fixing plate 1 in the thickness direction. A guide surface 2013 is arranged on a surface of one side of the shielding component 130 facing toward the boss 4. The guide surface 2013 extends obliquely toward the boss 4 along the insertion direction of the fixing apparatus 152. Therefore, by arranging the guide surface 2013, the guide surface 2013 has a guiding effect for the boss 4, so that the fixing apparatus 152 can be more smoothly assembled to the shielding component 130.

As shown in FIG. 14, before the plurality of power switch tubes 202 are tightly pressed, the boss 4 on the fixing plate 1 is vertically staggered from the guide surface 2013 on the shielding wall 133 of the shielding component 130, In this case, the plurality of elastic pieces 2 have not pressed to the corresponding power switch tubes 202.

During the downward insertion of the fixing apparatus 152, the boss 4 contacts the guide surface 2013 on the shielding wall 133 of the shielding component 130. Afterward, as the downward pressing continues, the fixing apparatus 152 as a whole moves toward the power switch tubes 202 under the stop action of the boss and the sidewall of the box. In this case, the plurality of elastic pieces 2 respectively receive the forces that are toward the fixing plate 1, so that the elastic pieces 2 changes from a state shown by dashed lines in FIG. 15 to a state shown by solid lines. In this case, the elastic deformation of the elastic piece 2 produces the appropriate axial pressure, so that the plurality of power switch tubes 202 can closely fit with the heat-dissipation wall of the shielding component 130.

Finally, a threaded fastener such as a screw may be passed through the fixing lug 3 to fix the fixing apparatus 152 to the shielding component 130, as shown in FIG. 15.

Figure 6:
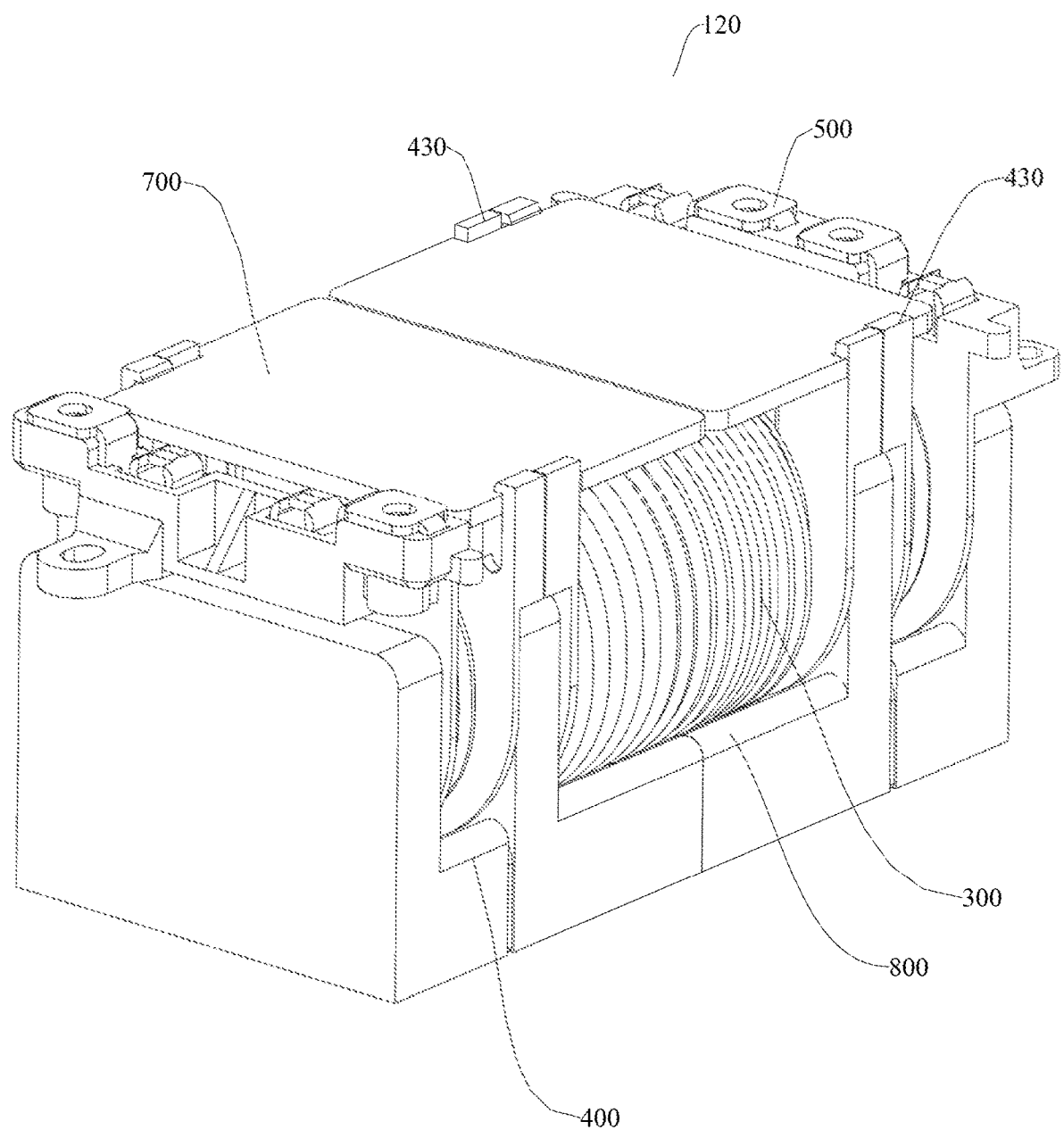
FIG. 6 is a schematic structural diagram of a magnetic device according to an embodiment of the present disclosure.

In the embodiment shown in FIG. 6, a thermal insulation layer 151 is sandwiched between the power switch tube 202 and the liquid passage member 132. Therefore, the thermal insulation layer 151 can transfer the heat of the power switch tube 202 during the operation to the liquid passage member 132, to reduce the temperature of the power switch tube 202 and improve the operating efficiency of the power switch tube 202. In addition, the thermal insulation layer 151 can further avoid the impact on the vehicle-mounted power supply apparatus 100 caused by the current leakage of the power switch tube 202, thereby improving the usage safety and reliability of the vehicle-mounted power supply apparatus 100.

In some embodiments, the coolant channel 131 is annular, and the coolant channel 131 surrounds the periphery of the magnetic device 120. In this way, the annular coolant channel 131 can allow the coolant to circulate in the channel, so that the coolant can better absorb the heat of the vehicle-mounted power supply apparatus 100, reduce the temperature of the vehicle-mounted power supply apparatus 100, and improve the operating efficiency of the vehicle-mounted power supply apparatus 100. In addition, by arranging the coolant channel 131 at the periphery of the electromagnetic device 120, the heat emitted by the magnetic device 120 during the operation can be absorbed by the coolant more quickly. This can improve the cooling effect of the coolant, to reduce the temperature of the vehicle-mounted power supply apparatus 100 during the operation, thereby improving the operating efficiency of the vehicle-mounted power supply apparatus 100.

In some embodiments, as shown in FIG. 3, a mounting groove 112 is provided at the mounting position 111, the magnetic device 120 is arranged in the mounting groove 112, the magnetic device 120 is connected to an inner wall of the mounting groove 112 through a screw, and a thermally conductive adhesive is arranged between the magnetic device 120 and the inner wall of the mounting groove 112. Therefore, the arrangement of the mounting groove 112 for assembling the magnetic device 120 further improves the assembly efficiency of the magnetic device 120. In addition, the connection of the magnetic device 120 through a screw makes the assembly of the magnetic deice 120 more convenient, and facilitates the disassembly and maintenance of electrical components, thereby improving the assembly efficiency of the vehicle-mourned power supply apparatus 100. In addition, with the thermal conductive adhesive arranged between the magnetic device 120 and the mounting groove 112, the heat generated by the magnetic device 120 during the operation can be transferred to the inner wall of the mounting groove 112 more quickly, so that the heat of the magnetic device 120 can be dissipated more quickly, thereby improving the operating efficiency of the vehicle-mounted power supply apparatus 100.

The magnetic device 120 according to the embodiments of the present disclosure will be described below with reference to FIG. 6 to FIG. 10.

As shown in FIG. 6 to FIG. 10, the magnetic device 120 according to an embodiment of the present disclosure includes a magnetic core, a coil 300, a skeleton 400, a wire nose 500, and a nut 600.

The coil 300 is wound on the magnetic core and has a pin 310. The skeleton 400 is arranged on the magnetic core. The wire nose 500 is mounted on the skeleton 400 and connected with die pin 310. The wire nose 500 has a connecting hole 510. The nut 600 is mounted on the skeleton 400, and the nut 600 has a threaded hole 610 corresponding to a position of the connecting hole 510.

In an embodiment, the circuit board connected with the magnetic device 120 may be arranged on ne side of the wire nose 500 facing away from the skeleton 400. The circuit board may be provided with a threaded fastener (for example, a bolt or screw). The threaded fastener may be passed through the connecting hole 510 and threadedly connected to the threaded hole 610. As such, an electrical and mechanical connection can be realized between the circuit board and the magnetic device 120.

For the magnetic device 120 according to the embodiment of the present disclosure, the coil 300 is wound on the magnetic core and has the pin 310, the skeleton 400 is arranged on the magnetic core, and the wire nose 500 is mounted on the skeleton 400 and connected with the pin 310. In this way, an electrical connection can be realized between the wire nose 500 and the coil 300, and an electrical connection is realized between the circuit board and the coil 300 through the electrical connection of the circuit board with the wire nose 500.

In addition, the wire nose 500 has the connecting hole 510, the nut 600 is mounted on the skeleton 400, the nut 600 has the threaded hole 610 corresponding to the position of the connecting hole 510, and the circuit board is connected to the threaded hole 610 of the nut 600 through the threaded fastener. The connection process is safe and reliable, the connection quality is easy to detect, the probability of damage of the magnetic device 120 is low, and the connection between the circuit board and the magnetic device 120 is stable. As welding is not required, the assembly and disassembly are convenient, providing a good component replaceability and maintainability.

Therefore, the magnetic device 120 according to the embodiment of the present disclosure has the advantages of good component replaceability and maintainability, reliable connection, easy detection of connection quality, and the like.

According to some embodiments of the present disclosure, as shown in FIG. 6 to FIG. 9, the wire nose 500 is movably mounted on the skeleton 400 to make the distance between the connecting hole 510 and the skeleton 400 adjustable. Since the circuit board is located on the side of the wire nose 500 facing away from the skeleton 400, the distance between the connecting hole 510 and the skeleton 400 can be adjusted by moving the wire nose 500, thereby improving the connection flatness between the magnetic device 120 and the circuit board.

According, to some embodiments of the present disclosure, as shown in FIG. 7 to FIG. 10, the wire nose 500 includes a plate portion 520, a bending portion 530, and a clamping portion 540. The connecting hole 510 is formed on the plate portion 520. The nut 600 is arranged between the plate portion 520 and the skeleton 400. One end of the bending portion 530 is connected to the plate portion 520. The bending portion 530 protrudes toward the skeleton 400. The bending portion 530 is movably mounted on the skeleton 400. The damping portion 540 is connected to the other end of the bending portion 530 and clamps the pin 310.

It can be understood that when the circuit board is threadedly engaged with the nut 600 through the threaded fastener, the plate portion 520 is located between the circuit board and the nut 600, so that the position between the wire nose 500 and the circuit board as well as the position of the nut 600 are fixed, and then through the engagement of the bending portion 530 with the skeleton 400, the position between the wire nose 500 and the skeleton 400 is fixed. Therefore, the stability of relative positions of the circuit board and the magnetic device 120 as a whole is increased. The clamping portion 540 can damp the pin 310 from two opposite sides of the pin 310 in a radial direction to increase the connection stability between the wire nose 500 and the pin 310. The clamping portion 540 and the pin 310 may be welded or crimped.

According to some embodiments of the present disclosure, as shown in FIG. 7 to FIG. 10, the bending portion 530 is configured as a U shape protruding toward the skeleton 400 to form a groove 531, and the clamping portion 540 is located in the groove 531. An opening direction of the clamping portion 540 is opposite to an opening direction of the groove 531. For example, the opening direction of the groove 531 faces away from the magnetic core, and the opening direction of the clamping portion 540 faces toward the magnetic core. The connection part between the pin 310 and the clamping portion 540 is located inside the groove 531, thereby reducing the probability of external contact with the pin 310. The connection part between the pin 310 and the clamping portion 540 can be protected by arranging the groove 531, so as to increase the stability of the overall connection of the magnetic device 120.

Figure 7:
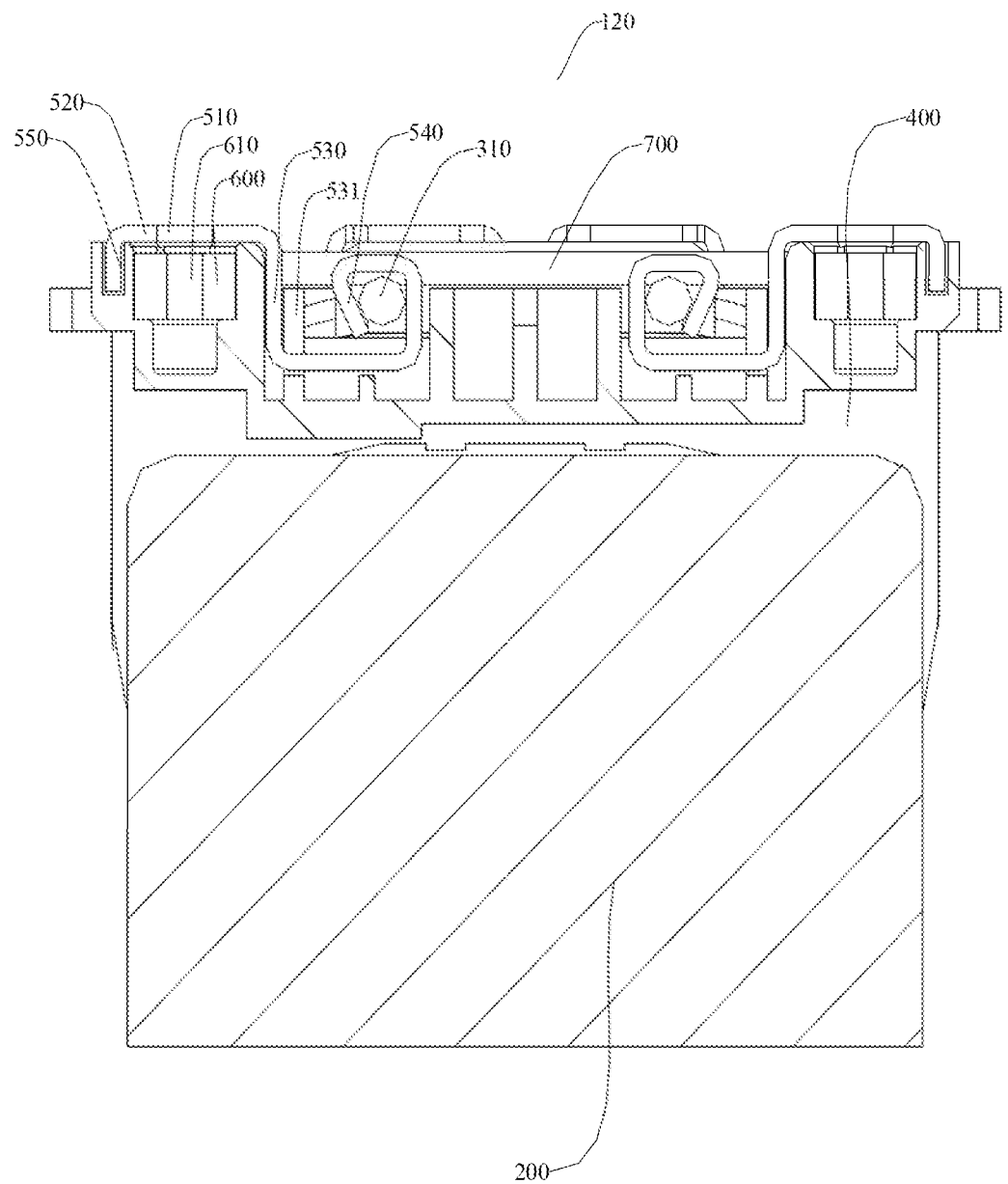
FIG. 7 is a cross-sectional view of a magnetic device according to an embodiment of the present disclosure.
Figure 8:
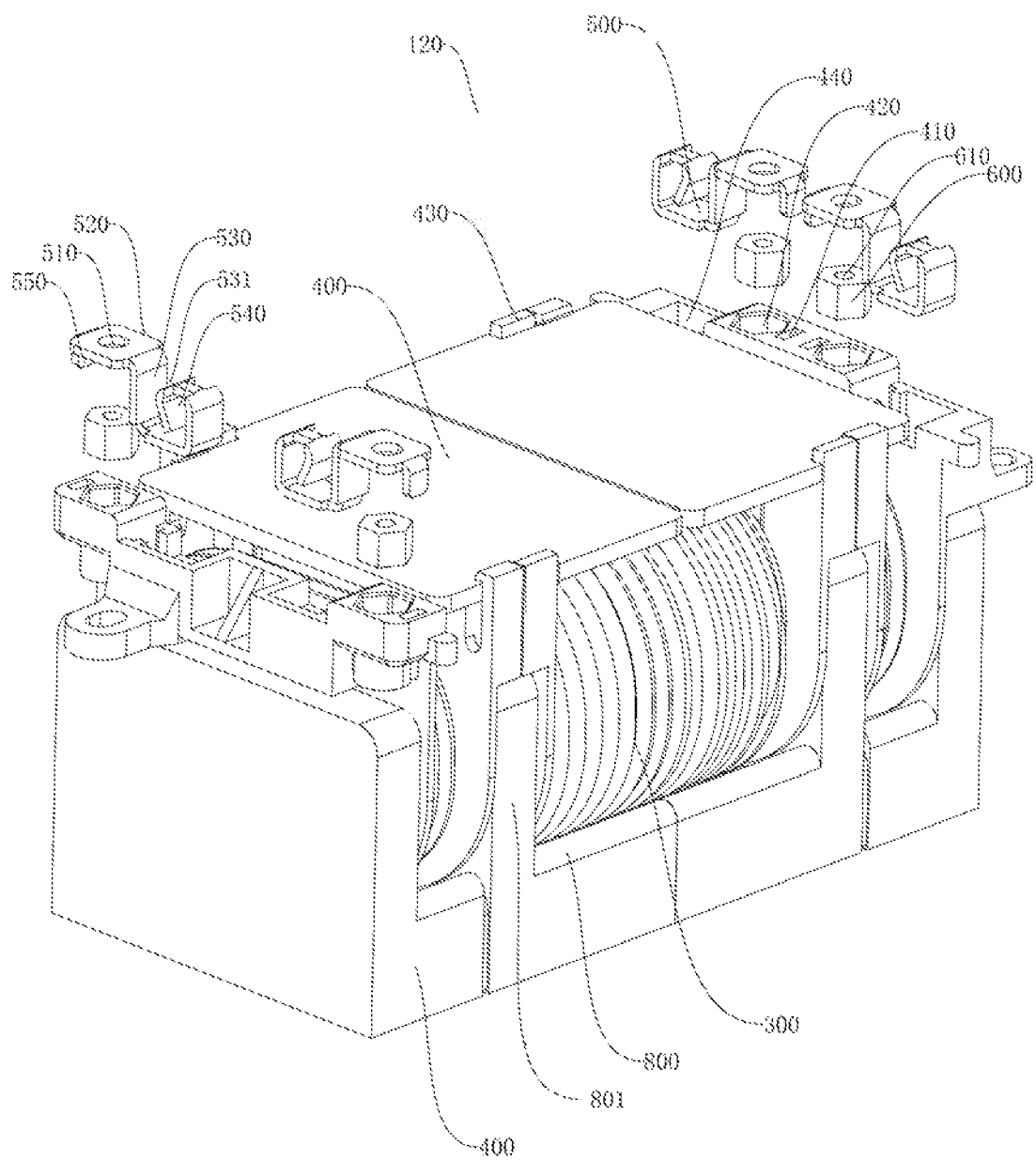
FIG. 8 is an exploded view of a magnetic device according to an embodiment of the present disclosure.
Figure 9:
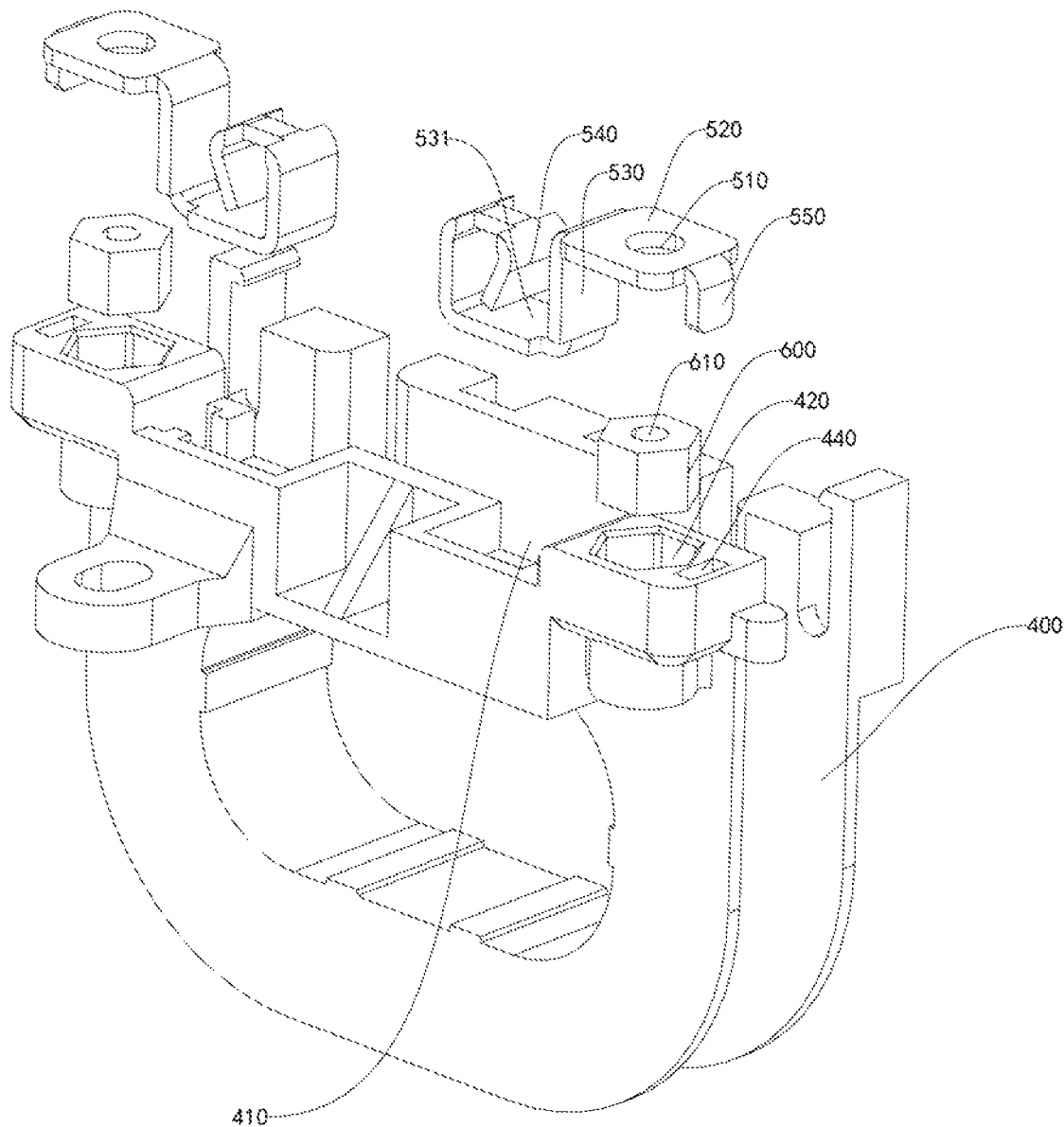
FIG. 9 is a schematic assembled view of a wire nose and a skeleton of a magnetic device according to an embodiment of the present disclosure.
Figure 10:
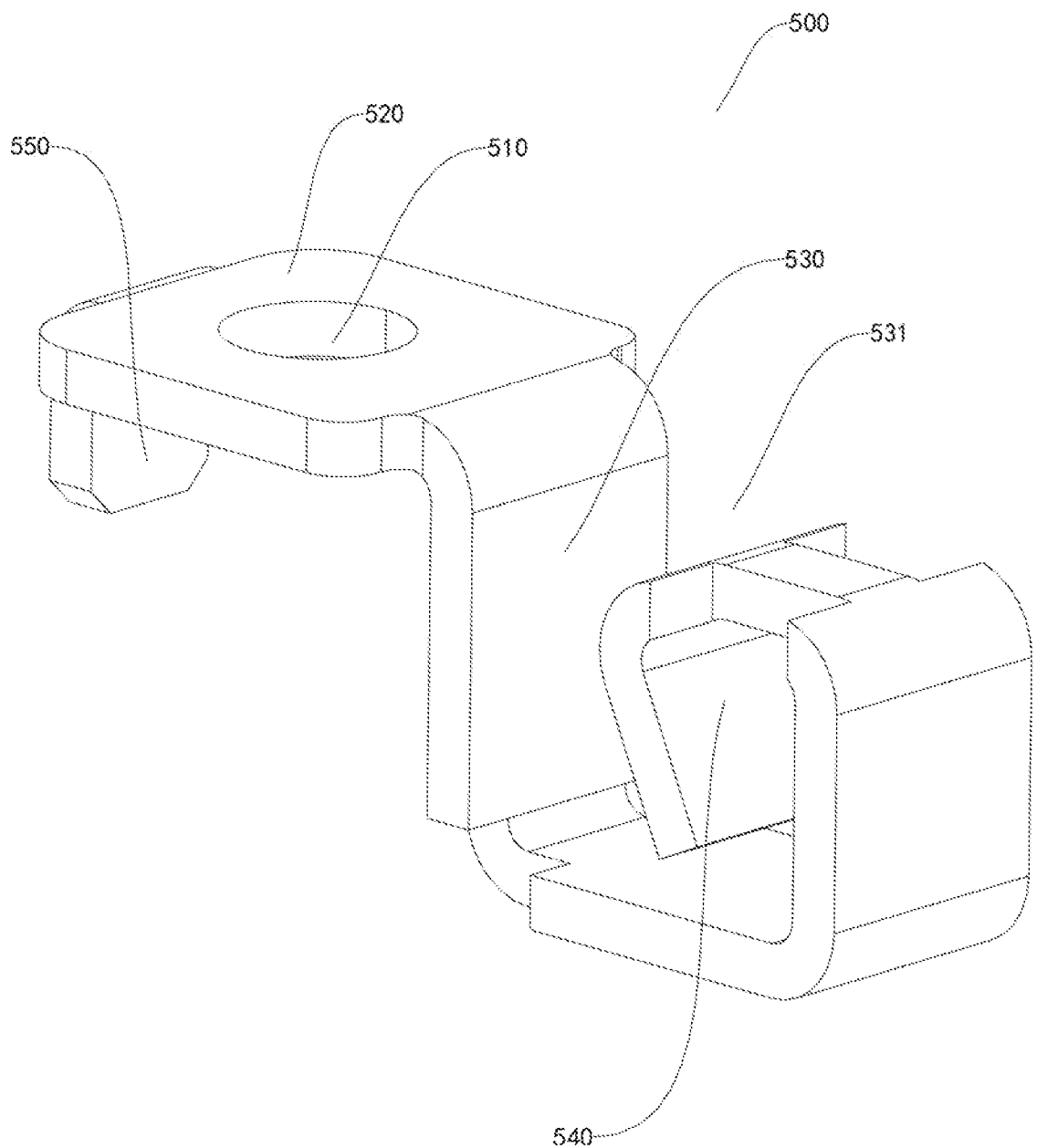
FIG. 10 is a schematic structural diagram of a wire nose of a magnetic device according to an embodiment of the present disclosure.

According to some embodiments of the present disclosure, as shown in FIG. 7 to FIG. 9, the skeleton 400 is provided with an assembly slot 410, and the bending portion 530 is movably engaged with the assembly slot 410. The bending portion 530 may be in an interference fit with the assembly slot 410. The wire nose 500 may be fixed to the skeleton 400 through a friction force between the bending portion 530 and the assembly slot 410. When an external force on the wire nose 500 is greater than the friction force between the bending portion 530 and the assembly slot 410, the wire nose 500 can move relative to the skeleton 400. With the arrangement of the assembly slot 410, on the one hand, it can be used to accommodate the bending portion 530, to reduce the overall volume of the magnetic device 120, and facilitate the product miniaturization. On the other hand, the relative positions of the skeleton 400 and the wire nose 500 can be fixed through the engagement of the bending portion 530 with the assembly slot 410, thereby improving the overall structural strength of the magnetic device 120.

According to some embodiments of the present disclosure, as shown in FIG. 7 to FIG. 9, the skeleton 400 is provided with an anti-rotation groove 420, the nut 600 is arranged in the anti-rotation groove 420, and a distance between the plate portion 520 and a bottom of the anti-rotation groove 420 is greater than an axial length of the nut 600. It can be understood that the nut 600 is non-circular, and a shape of the anti-rotation groove 420 matches a shape of the nut 600, for example, both of the two are hexagonal. The nut 600 is fixed with respect to the relative position of the anti-rotation groove 420 along a circumferential direction. Therefore, when the threaded fastener (such as a bolt or screw) of the circuit board is passed through the connecting hole 510 and engaged with the nut 600, the nut 600 is prevented from rotating due to a circumferential force received by the nut 600, which increases the convenience of assembly. As the distance between the plate portion 520 and the bottom wall of the anti-rotation groove 420 is greater than the axial length of the nut 600, the axial position of the nut 600 can be adjusted. In addition, a shortest distance between the plate portion 520 and the surface of the skeleton 400 facing toward the plate portion 520 may be less than the axial length of the nut 600, to prevent the nut 600 from falling off from the anti-rotation groove 420.

According to some embodiments of the present disclosure, as shown in FIG. 7 to FIG. 10, the wire nose 500 further includes a positioning protrusion 550, the positioning protrusion 550 and the bending portion 530 are respectively connected to two opposite side edges of the plate portion 520. The skeleton 400 is provided with a positioning groove 440, and the positioning protrusion 550 is engaged with the positioning groove 440. The positioning protrusion 550 extends along an edge of the plate portion 520 toward the skeleton 400. The engagement of the positioning protrusion 550 and the positioning groove 440 makes the connection between the wire nose 500 and the skeleton 400 more stable, so that the relative positions of the wire nose 500 and the skeleton 400 are further fixed.

According to some embodiments of the present disclosure, as shown in FIG. 6 to FIG. 8, the magnetic device 120 further includes a magnetic circuit piece 801 and at least one magi etic sheet 700, the magnetic core and skeleton 400 are carried on the magnetic circuit piece 801, and the magnetic sheet 700 is mounted on the skeleton 400. The magnetic sheet 700 may contain a magnetic material. The magnetic sheet 700 may have a high permeability to effectively shield magnetic leakage generated by the coil 300. In addition, the magnetic sheet 700 may have a high resistivity to reduce an eddy current loss caused by the addition of the magnetic sheet 700, thereby reducing the amount of heat generated by the magnetic device 120 and improving the overall efficiency of the magnetic device 120.

As shown in FIG. 8, the magnetic device 120 further includes a supporting portion 800. The supporting portion 800 is configured to support the coil 300. The supporting portion 800 is connected with the magnetic circuit piece 801, and the supporting portion 800 and the magnetic circuit piece 801 form an L-shaped structure. The magnetic core is arranged on one side of the magnetic circuit piece 801 facing toward the coil 300, and the magnetic core is arranged in the coil 300.

According to some embodiments of the present disclosure, as shown in FIG. 6 to FIG. 8, the magnetic sheet 700 and the magnetic circuit piece 801 are respectively arranged on two opposite sides of the magnetic core. Since both the magnetic sheet 700 and the magnetic circuit piece 801 generate eddy current losses, the magnetic sheet 700 and the magnetic circuit piece 801 are respectively arranged on the two opposite sides of the transformer to prevent the concentration of heat generated by the magnetic sheet 700 and the magnetic circuit piece 801 and improve the heat dissipation efficiency for the magnetic sheet 700 and the magnetic circuit piece 801, thereby improving the overall efficiency of the magnetic device 120. In addition, the skeleton 400 is provided with a hook 430, and the hook 430 is hooked to an edge of the magnetic sheet 700. A plurality of books 430 may be arranged. The plurality of hooks 430 may be booked at least to the two opposite side edges of the magnetic sheet 700 to increase the relative stability between the magnetic sheet 700 and the skeleton 400 and ensure the overall structural strength of the magnetic device 120.

In some embodiments, the shielding component 130 and the housing 110 are integrally formed. In this way, steps required for fabricating the shielding component 130 and the housing 110 can be saved, the process of fabricating the shielding component 130 and the housing 110 can be simplified, the connection strength between the shielding component 130 and the housing 110 can be improved, and the overall structural strength of the vehicle-mounted power supply apparatus 100 can be increased.

As shown in FIG. 1 and FIG. 2, in some embodiments, a support 113 is arranged at a periphery of the housing 110, and the support 113 and the housing 110 are integrally formed. As shown above, the integral forming can save the steps required for fabricating the support 113 and the housing 110, simplify the process of fabricating the support 113 and the housing 110, improve the connection strength between the support 113 and the housing 110, and increase the overall structural strength of the vehicle-mounted power supply apparatus 100. In addition, the support 113 can provide supporting stability for the housing 110, so that the loaded vehicle-mounted power supply apparatus 100 has a higher usage safety and reliability.

Referring to FIG. 15, a vehicle 1000 according to an embodiment of the present disclosure includes the vehicle-mounted power supply apparatus 100 described above. In this way, the vehicle 1000 equipped with the vehicle-mounted power supply apparatus 100 has a good heat dissipation effect, which can reduce the operating temperature of the vehicle-mounted power supply apparatus 100 during the operation of the vehicle 1000, thereby improving the operating efficiency of the vehicle-mounted power supply apparatus 100.

In the description of this specification, the description of the reference terms such as "an embodiment", "some embodiments", "exemplary embodiments", "example", "specific example", or "some examples" means that the features, structures, materials or characteristics described with reference to the embodiment or example are included in at least one embodiment or example of the present disclosure. In this specification, exemplary descriptions of the foregoing terms do not necessarily refer to the same embodiment or example.

Although the embodiments of the present disclosure have been shown and described, a person of ordinary skill in the art should understand that various changes, modifications, replacements and variations may be made to the embodiments without departing from the principles and spirit of the present disclosure, and the scope of the present disclosure is as defined by the appended claims and their equivalents.

What is claimed is:

1. A vehicle-mounted power supply apparatus, comprising:
    a housing comprising a mounting position;
    a magnetic device comprising an integrated part disposed at the mounting position; and
    a shielding component disposed in the housing and surrounding a periphery of the mounting position;
    wherein the magnetic device comprises:
        a magnetic core;
        a coil, wherein the coil is wound on the magnetic core and has a pin;
        a skeleton, wherein the skeleton is disposed on the magnetic core;
        a wire nose, wherein the wire nose is mounted on the skeleton and connected with the pin, and the wire nose has a connecting hole; and
        a nut, wherein the nut is mounted on the skeleton, and the nut has a threaded hole corresponding to a position of the connecting hole.

2. The apparatus according to claim 1, wherein a coolant channel is formed in the shielding component, and the coolant channel surrounds a periphery of the magnetic device.

3. The apparatus according to claim 2, wherein the shielding component comprises:
    a liquid passage member, wherein the coolant channel is formed in the liquid passage member; and
    a shielding wall, wherein the shielding wall is separated from the liquid passage member, and the shielding wall is located on a side of the liquid passage member away from the magnetic device.

4. The apparatus according to claim 3, wherein
one side of the coolant channel comprises an opening; and
the shielding component further comprises:
    a liquid passage cover plate, wherein the liquid passage cover plate is connected with the liquid passage member to close the opening; and
    a sealing ring, wherein the sealing ring is disposed between the liquid passage cover plate and the liquid passage member.

5. The apparatus according to claim 4, wherein the liquid passage member comprises a first sidewall and a second sidewall opposite to the first sidewall, the coolant channel is formed between the first sidewall and the second sidewall, the first sidewall is adjacent to the magnetic device, the second sidewall is located opposite to the first sidewall away from the magnetic device, and a distance between the first sidewall and the second sidewall increases in a direction towards the opening.

6. The apparatus according to claim 3, further comprising:
    a circuit board;
    a plurality of power switch tubes, wherein each of the power switch tubes is electrically connected with the circuit board; and
    a fixing apparatus, wherein the fixing apparatus is configured for simultaneously fixing the power switch tubes between the liquid passage member and the shielding wall.

7. The apparatus according to claim 6, wherein the fixing apparatus comprises:
    a fixing plate; and
    a plurality of elastic pieces, wherein each of the elastic pieces is configured for fixing one of the power switch tubes, a first end of each of the elastic pieces is fixed to the fixing plate, and a second end of each of the elastic pieces is located on a first side of the fixing plate in a thickness direction and is separated from a surface on the first side of the fixing plate.

8. The apparatus according to claim 7, wherein each of the elastic pieces comprises:
    a fixing segment, wherein the fixing segment is fixed on the fixing plate;
    a connection segment; and
    a pressing segment, wherein the connection segment is connected between the fixing segment and the pressing segment, the pressing segment comprises a first pressing portion and a second pressing portion, a first end of the first pressing portion is connected with the connection segment, a second other end of the first pressing portion extends away from the fixing plate, a first end of the second pressing portion is connected with the second end of the first pressing portion, and a second end of the second pressing portion extends towards the fixing plate.

9. The apparatus according to claim 7, wherein at least one boss is disposed on a second side of the fixing plate in the thickness direction, and a cross-sectional area of the boss gradually decreases in a direction away from the fixing plate; and the boss is formed by a part of the fixing plate protruding from the surface on the first side of the fixing plate towards a surface on the second side of the fixing plate.

10. The apparatus according to claim 7, wherein
an edge of the fixing plate comprises at least one pull lug extending away from a center of the fixing plate;
the fixing apparatus further comprises at least one pull lug piece, wherein the pull lug piece is disposed on a first side of the pull lug in a thickness direction; and
the edge of the fixing plate comprises at least one fixing lug, and an end of the fixing lug extends towards a second side of the fixing plate.

11. The apparatus according to claim 1, wherein
the wire nose is movably mounted on the skeleton to adjust a distance between the connecting hole and the skeleton; and
the wire nose comprises:
a plate portion, wherein the connecting hole is formed in the plate portion, and the nut is disposed between the plate portion and the skeleton;
a bending portion, wherein a first end of the bending portion is connected to the plate portion, the bending portion protrudes towards the skeleton, the bending portion is movably mounted on the skeleton, and the bending portion is configured as a U shape protruding towards the skeleton to form a groove; and
a clamping portion, wherein the clamping portion is connected to a second end of the bending portion and clamps the pin, and the clamping portion is located in the groove.

12. The apparatus according to claim 11, wherein the skeleton comprises an anti-rotation groove, the nut is disposed in the anti-rotation groove, and a distance between the plate portion and a bottom wall of the anti-rotation groove is greater than an axial length of the nut.

13. The apparatus according to claim 11, wherein the wire nose further comprises:
a positioning protrusion, wherein the positioning protrusion and the bending portion are respectively connected to two opposite side edges of the plate portion, the skeleton comprises a positioning groove, and the positioning protrusion is engaged with the positioning groove.

14. The apparatus according to claim 1, further comprising:
a magnetic circuit piece, wherein the magnetic core and the skeleton are disposed on the magnetic circuit piece; and
at least one magnetic sheet, wherein the magnetic sheet is mounted on the skeleton, the magnetic sheet and the magnetic circuit piece are respectively arranged on two opposite sides of the magnetic core, the skeleton comprises a hook, and the hook is hooked to an edge of the magnetic sheet.

15. A vehicle, comprising a vehicle-mounted power supply apparatus, wherein the vehicle-mounted power supply apparatus comprises:
a housing comprising a mounting position;
a magnetic device comprising an integrated part disposed at the mounting position; and
a shielding component disposed in the housing and surrounding a periphery of the mounting position;
wherein a coolant channel is formed in the shielding component, the coolant channel surrounds a periphery of the magnetic device, and one side of the coolant channel comprises an opening; and
wherein the shielding component comprises:
a liquid passage member, wherein the coolant channel is formed in the liquid passage member;
a shielding wall, wherein the shielding wall is separated from the liquid passage member, and the shielding wall is located on a side of the liquid passage member away from the magnetic device;
a liquid passage cover plate, wherein the liquid passage cover plate is connected with the liquid passage member to close the opening; and
a sealing ring, wherein the sealing ring is disposed between the liquid passage cover plate and the liquid passage member.

16. The vehicle according to claim 15, wherein the liquid passage member comprises a first sidewall and a second sidewall opposite to the first sidewall, the coolant channel is formed between the first sidewall and the second sidewall, the first sidewall is adjacent to the magnetic device, the second sidewall is located opposite to the first sidewall away from the magnetic device, and a distance between the first sidewall and the second sidewall increases in a direction towards the opening.

17. A vehicle-mounted power supply apparatus, comprising:
a housing comprising a mounting position;
a magnetic device comprising an integrated part disposed at the mounting position; and
a shielding component disposed in the housing and surrounding a periphery of the mounting position;
wherein a coolant channel is formed in the shielding component, and the coolant channel surrounds a periphery of the magnetic device;
wherein the shielding component comprises:
a liquid passage member, wherein the coolant channel is formed in the liquid passage member; and
a shielding wall, wherein the shielding wall is separated from the liquid passage member, and the shielding wall is located on a side of the liquid passage member away from the magnetic device; and
wherein the apparatus further comprises:
a circuit board;
a plurality of power switch tubes, wherein each of the power switch tubes is electrically connected with the circuit board; and
a fixing apparatus, wherein the fixing apparatus is configured for simultaneously fixing the power switch tubes between the liquid passage member and the shielding wall.

18. The apparatus according to claim 17, wherein the fixing apparatus comprises:
a fixing plate; and
a plurality of elastic pieces, wherein each of the elastic pieces is configured for fixing one of the power switch tubes, a first end of each of the elastic pieces is fixed to the fixing plate, and a second end of each of the elastic pieces is located on a first side of the fixing plate in a thickness direction and is separated from a surface on the first side of the fixing plate.

19. The apparatus according to claim 18, wherein each of the elastic pieces comprises:
a fixing segment, wherein the fixing segment is fixed on the fixing plate;
a connection segment; and
a pressing segment, wherein the connection segment is connected between the fixing segment and the pressing segment, the pressing segment comprises a first pressing portion and a second pressing portion, a first end of the first pressing portion is connected with the connection segment, a second other end of the first pressing portion extends away from the fixing plate, a first end of the second pressing portion is connected with the second end of the first pressing portion, and a second end of the second pressing portion extends towards the fixing plate.

20. The apparatus according to claim 18, wherein at least one boss is disposed on a second side of the fixing plate in the thickness direction, and a cross-sectional area of the boss gradually decreases in a direction away from the fixing plate; and the boss is formed by a part of the fixing plate protruding from the surface on the first side of the fixing plate towards a surface on the second side of the fixing plate.

21. The apparatus according to claim 18, wherein
an edge of the fixing plate comprises at least one pull lug extending away from a center of the fixing plate;
the fixing apparatus further comprises at least one pull lug piece, wherein the pull lug piece is disposed on a first side of the pull lug in a thickness direction; and
the edge of the fixing plate comprises at least one fixing lug, and an end of the fixing lug extends towards a second side of the fixing plate.

* * * * *